(12) United States Patent
Fredriksson

(10) Patent No.: US 7,053,723 B2
(45) Date of Patent: May 30, 2006

(54) OSCILLATORS WITH ACTIVE HIGHER-IN-ORDER PHASE SHIFT FILTERING

(75) Inventor: Jesper Fredriksson, Uppsala (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 76 days.

(21) Appl. No.: 10/467,489

(22) PCT Filed: Jun. 20, 2001

(86) PCT No.: PCT/SE01/01426

§ 371 (c)(1),
(2), (4) Date: Nov. 20, 2003

(87) PCT Pub. No.: WO02/065631

PCT Pub. Date: Aug. 22, 2002

(65) Prior Publication Data

US 2004/0070461 A1    Apr. 15, 2004

(30) Foreign Application Priority Data

Feb. 13, 2001  (SE) .................. PCT/SE01/00283

(51) Int. Cl.
*H03B 5/32* (2006.01)
(52) U.S. Cl. .................................. 331/135; 331/107 A
(58) Field of Classification Search .............. 331/135, 331/107 A, 193, 56, 114; 333/193
See application file for complete search history.

(56) References Cited

U.S. PATENT DOCUMENTS

| | | | | |
|---|---|---|---|---|
| 4,891,610 | A * | 1/1990 | Veith | 331/96 |
| 5,859,572 | A * | 1/1999 | Hill | 331/56 |
| 5,874,866 | A * | 2/1999 | Satoh et al. | 331/107 A |
| 6,727,767 | B1 * | 4/2004 | Takada | 331/107 A |

* cited by examiner

*Primary Examiner*—Dinh T. Le

(57) ABSTRACT

The present invention proposes a new way of improving the phase stability and frequency selectivity of a phase shift oscillator (100). By introducing a filter-order enhancing feedback loop (124) in association with a phase shift filter (122) in the oscillator, higher-order phase shift filtering can be achieved without using inductive elements as in conventional higher-order LC phase shift filters. This is a great advantage, since a high Q-value can be obtained without limited by the relatively high internal losses of inductive elements (L).

12 Claims, 14 Drawing Sheets

US 7,053,723 B2

OSCILLATORS WITH ACTIVE HIGHER-IN-ORDER PHASE SHIFT FILTERING

TECHNICAL FIELD OF THE INVENTION

The present invention generally relates to the field of oscillator design, and more specifically to the issue of oscillator phase stability.

BACKGROUND OF THE INVENTION

Oscillators can be found in numerous fields of technology, and are widely used for example in computers, telecommunication equipment and other electronic systems. With the ever-increasing demand for faster and more effective electronic systems comes the need for more and more sophisticated oscillators. In particular, the ever-increasing data processing and transmission rates in modern electronic systems reduce the timing margins between correlated signals and events.

In this respect, a major source of uncertainty are the variations, commonly referred to as phase noise or jitter, in the output signal period of the various clock signals that are used as timing references in such a system. Therefore, clock oscillators with high phase stability and low phase noise are of outmost importance in synchronous high-speed electronic systems.

SUMMARY OF THE INVENTION

It is a general object of the invention to provide a high quality oscillator with excellent oscillation properties.

It is a particular object of the invention to improve the oscillator phase stability and frequency selectivity.

It is also an object of the invention to design an oscillator without the use of inductors or similar low quality components.

Yet another object of the invention is to provide an oscillator that is capable of operating in high performance, high speed digital electronic systems and communication links with tight timing requirements and/or harsh spectral purity requirements.

These and other objects are met by the invention as defined by the accompanying patent claims.

The present invention proposes a new way of improving the phase stability and frequency selectivity of a phase shift oscillator. By introducing a filter-order enhancing feedback loop in association with a phase shift filter in the oscillator, higher-order phase shift filtering can be achieved without using inductive elements as in conventional higher-order LC phase shift filters. This is a great advantage, since a high Q-value can be obtained without being limited by the relatively high internal losses of inductive elements (L).

In a preferred realization, the proposed higher-order phase shift filter includes an active amplifying element in connection with an internal feedback loop. Advantageously, the active element is provided in the form of an inverting amplifier, which is further arranged together with an input capacitor blocking the input of the inverting amplifier and an output capacitor shunting the output of the inverting amplifier to ground.

For improved flexibility, the filter-order enhancing feedback loop may be realized as a number of interconnected reactive blocks, each one of which is individually weighted for providing a customized, application-specific frequency response of the corresponding phase shift filter.

The invention offers the following advantages:

Excellent oscillation properties;
High phase stability; and
Improved and customized frequency selectivity.

Other advantages offered by the present invention will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION OF EMBODIMENTS OF THE INVENTION

A fundamental property for high phase stability in oscillators is low phase noise, and therefore it is important to have a clear understanding of the underlying mechanisms that affect the phase noise characteristics. In order to obtain an oscillator output signal with high spectral purity and low phase noise, frequency selective circuits are generally introduced in the oscillator feedback system such that signal components at frequencies away from the desired oscillation frequency will be attenuated and no longer fulfil Barkhaussen's conditions for self-sustained oscillation.

In this regard, it has been recognized that the phase noise enhancement is closely related to the frequency characteristics of the frequency selective circuits in the oscillator feedback system, and that a sharp filter function of higher order in the oscillator feedback system gives a more narrow frequency output range and increased spectral purity.

In conventional wide-band oscillator loops with poor frequency selectivity normally encountered in ring topologies, the attenuation unaided has a 20 dB increase per frequency decade. Cross-coupled high impedance oscillators using inductive-capacitive (LC) resonant filter networks typically have a 20 dB improvement in attenuation and serve as an industry standard for low phase noise characteristics. However, the improvement of the cross-coupled LC oscillators comes at the price of being limited to bulky, inductive (L) elements with relatively high internal losses that severely degrade the oscillator quality value.

Consequently, there is a general demand for an oscillator that provides at least the same order of frequency selectivity as conventional LC oscillators, but without incorporating bulky inductive elements or similar low quality components.

The present invention proposes the introduction of a filter-order enhancing feedback loop in association with a phase shift filter in the oscillator feedback system in order to provide higher-order phase shift filtering.

Figure 1:
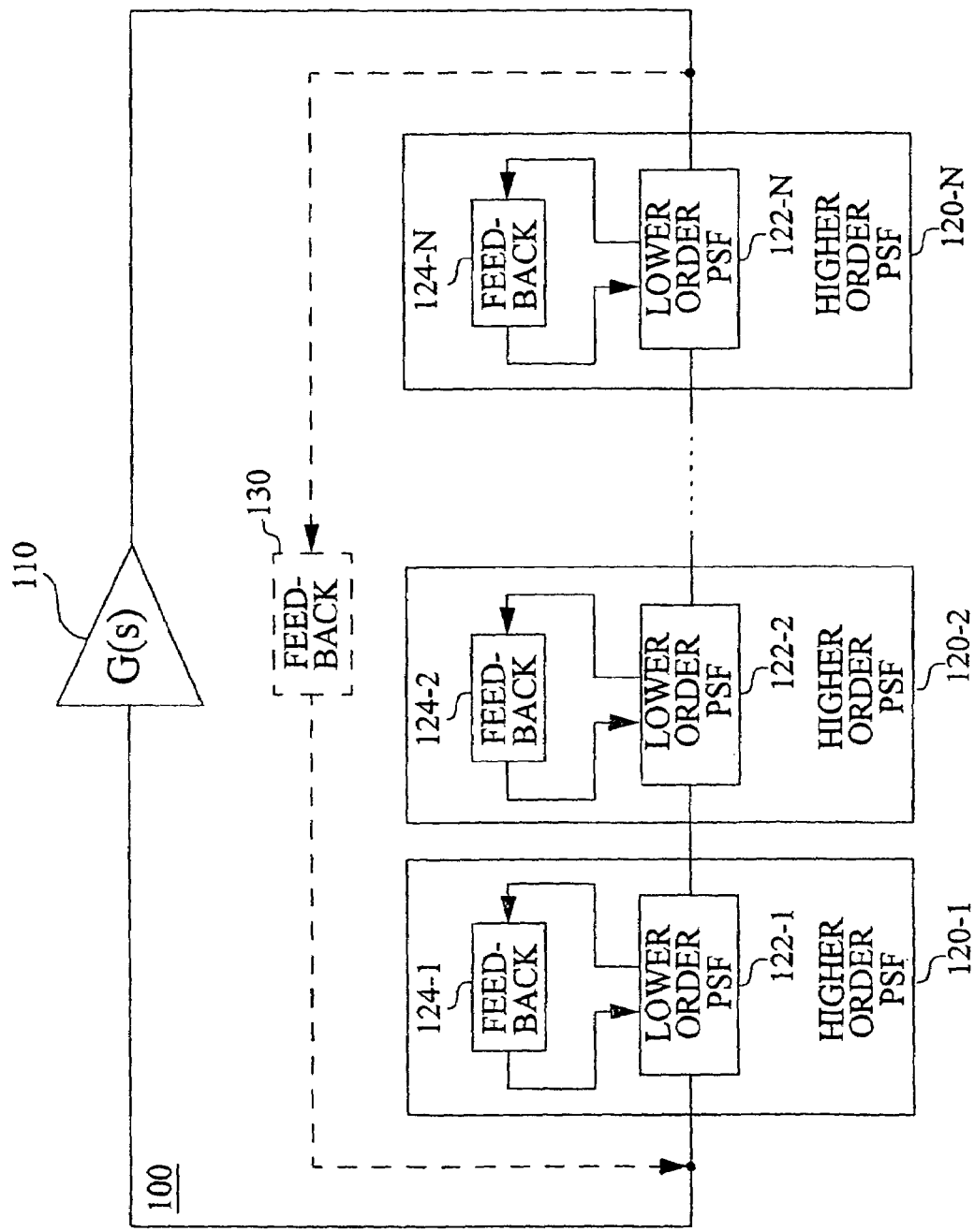
FIG. 1 is a conceptual top-level diagram of an oscillator feedback system according to the invention.

FIG. 1 is a conceptual top-level diagram of an oscillator feedback system according to the invention. The oscillator is here viewed as a feedback system, which is based on a new type of higher-order phase shift filter. The oscillator feedback system 100 basically comprises a general gain block 110 and a selectable number N of higher-order phase shift filters 120-1 to 120-N according to the invention. Each higher-order phase shift filter (PSF) 120-n comprises a lower-order phase shift filter 122-n and a filter-order enhancing feedback loop 124n, where n is an integer from 1 to N. It has been recognized that a properly configured feedback loop in connection with an ordinary phase shift filter provides higher-order phase shift filtering and improves the frequency selectivity. The complexity of the filter-order enhancing feedback loop may vary, ranging from a purely resistive feedback to more complex combinations of various reactive elements, as will be described later on.

Although all the PSFs in the oscillator feedback system are illustrated as higher-order PSFs with internal feedback loops, it should be understood that a sufficient condition for improving the frequency selectivity is that at least one phase shift filter is provided in the form of a higher-order PSF according to the invention.

In addition, or as an alternative, a filter-order enhancing feedback loop 130 may be arranged around one or more PSFs in the oscillator feedback system. In this way, there may be several levels of filter-order enhancing feedback loops in the oscillator feedback system. Although, the feedback loop 130 is external to the PSFs, it is still an internal loop with respect to the overall oscillator feedback system 100.

The gain block 110 has a transfer function G(s) and provides the necessary amplification to compensate for the attenuation and losses in the phase shift filters. In FIG. 1, the gain block 110 is illustrated as a separate unit but it may be distributed, completely or partly, into the PSFs 120.

Figure 2:
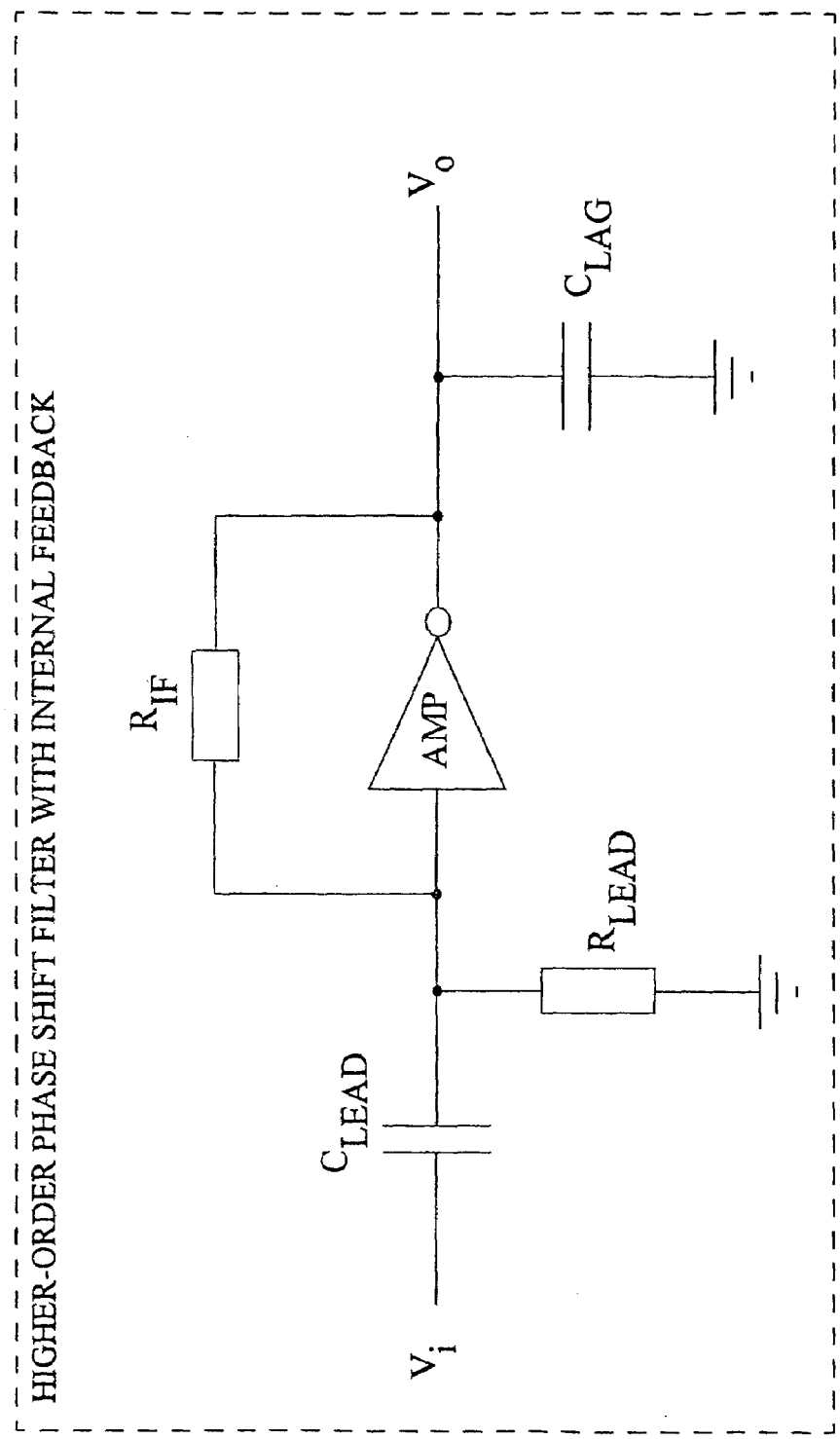
FIG. 2 is a schematic circuit diagram of a higher-order phase shift filter with internal feedback according to a preferred embodiment of the invention.

For a better understanding of the invention, a more detailed example of a higher-order phase shift filter with internal feedback will now be described with reference to FIG. 2. FIG. 2 is a schematic circuit diagram of a higher-order phase shift filter with internal feedback according to a preferred embodiment of the invention. In this embodiment, the phase shift filter is configured as a lead-and-lag network formed around an inverting amplifier (AMP), which has a resistive filter-order enhancing feedback loop $R_{IF}$. The lead-and-lag function is formed by proper insertion of two capacitive elements. A first phase advancing (differentiating) link is formed by inserting a block capacitive element $C_{LEAD}$ in the input signal path of the inverting amplifier, together with a resistance $R_{LEAD}$ to ground. On the output, a shunt capacitor $C_{LAG}$ to ground will act phase retarding (integrating) when the inverting amplifier is loaded. Altogether, the inverting amplifier, the associated internal feedback and the capacitive elements form a frequency selective lead-and-lag network, effectively operating as if a resonant filter was present.

In order to gain some insight into the operation of the phase shift filter and in particular the impact of the internal feedback on the frequency characteristics of the filter, a simplified analysis of the phase shift filter of FIG. 2 will now be made with reference to the electrical equivalent model of FIG. 3. The model reflects a generic implementation of the phase shift filter of FIG. 2 based on a lead-and-lag configuration with a general feedback element. The inverting amplifier of FIG. 2 is here replaced by an equivalent circuit that models the small signal gain using a voltage controlled current source with transconductance $g_m$. Frequency dependent parts of the amplifier model are incorporated into the input and output sections for simplicity without any loss of generality. The output impedance of the transistor is also neglected.

The differentiating input lead section provides a phase advance, while the integrating output lag section provides a phase retard of the signal. The nominal phase shift at the oscillation frequency is either zero or 180 degrees (inverted operation) depending on the configuration. Any other target phase shift is however possible, but at the expense of reduced phase slope and ultimately increased jitter. Both in-phase and cross-coupled topologies may benefit from the enhanced internal feedback phase shift filter of the invention. In addition, the lower frequency phase shift is near quadrature (90 degrees), thus eliminating the possibility for spurious oscillations in a high gain region. The differentiation is essentially a high-pass filter with a signal block capacitor and a shunt resistor to ground, thus providing an effective DC block. The integration is implemented by loading the amplifier with a capacitive shunt to ground.

Applying Kirchoff's current summation law for the input lead section:

$$(V_i - V_A) \cdot sC_{LEAD} + \frac{(V_o - V_A)}{Z_F} = \frac{V_A}{R_{LEAD}} \qquad (1)$$

where the reactance is represented in the Laplace domain.

Applying Kirchoff's current summation law for the output lag section:

$$\frac{(V_o - V_A)}{Z_F} + g_m V_A + V_o \cdot sC_{LAG} = 0 \qquad (2)$$

Expression (2) can be rewritten as:

$$V_A = \frac{1 + sZ_F C_{LAG}}{1 - g_m Z_F} \cdot V_o \qquad (3)$$

Expressions (1) and (3) give the transfer function F(s) of the phase shift filter:

$$F(s) = \frac{V_o}{V_i} \qquad (4)$$

$$= \frac{sZ_F C_{LEAD}(1 - g_m Z_F)}{(1 - g_m Z_F) + \left(1 + \dfrac{Z_F}{R_{LEAD}} + sZ_F C_{LEAD}\right)(1 + sZ_F C_{LAG})}$$

The phase shift function is then extracted from expression (4) in the frequency domain (s=jω):

$$\phi(\omega) = \arg[F(\omega)] = \arg\left[\frac{N(\omega)}{D(\omega)}\right] = -\frac{\pi}{2} - \arg[D(\omega)] \qquad (5)$$

The denominator D(ω) is given by:

$$D(\omega) = 1 - g_m Z_F + \left(1 + \frac{Z_F}{R_{LEAD}} + j\omega Z_F C_{LEAD}\right)(1 + j\omega Z_F C_{LAG}) \qquad (6)$$

Provided that $g_m Z_F \gg 1$, $Z_F/R_{LEAD} \ll 1$, expression (6) can be approximated as:

$$D(\omega) \approx -g_m Z_F + \left(1 + j\frac{\omega}{\omega_{LEAD}}\right)\left(1 + j\frac{\omega}{\omega_{LAG}}\right) \qquad (7)$$

$$= 1 - g_m Z_F - \frac{\omega^2}{\omega_{LEAD}\omega_{LAG}} + j\omega\left(\frac{1}{\omega_{LEAD}} + \frac{1}{\omega_{LAG}}\right)$$

Figure 3:
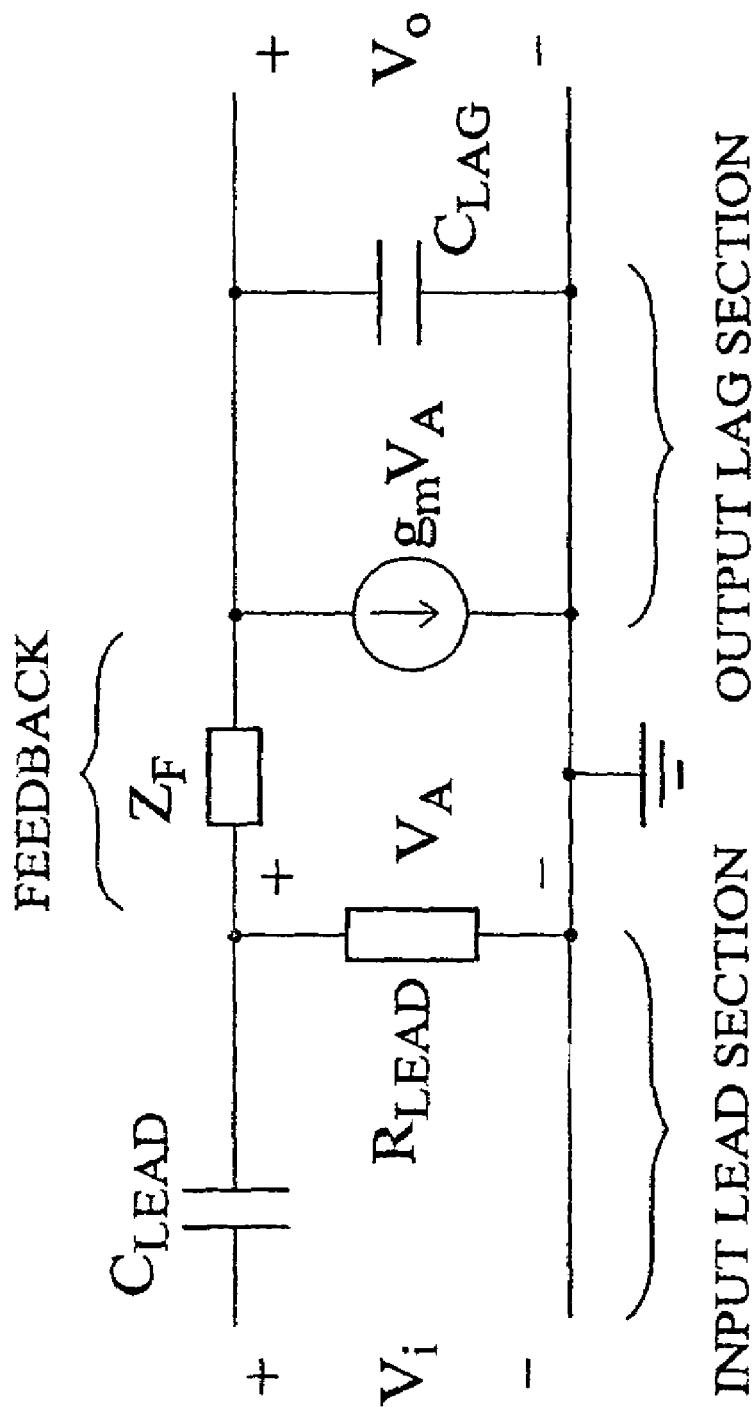
FIG. 3 is a schematic mid-frequency small signal AC electrical equivalent model of the phase shift filter of FIG. 2.

The performance characteristics of the phase shift filter of FIG. 3 is then analyzed by introducing a reference topology in form of a simple second order LC filter with known performance properties, and comparing the two topologies.

The reference topology is selected as a second order LC filter configured with a block capacitor and a shunt inductor. The transfer function $F_{LC}(s)$ of the reference filter is given by:

$$F_{LC}(s) = \frac{V_o}{V_i} = \frac{s^2 LC}{1 + s^2 LC + sRC} \qquad (8)$$

The denominator D(ω) of the corresponding phase shift function in the frequency domain (s=jω)) is then given by:

$$D_{LC}(\omega) = 1 - \omega^2 LC + j\omega RC \qquad (9)$$

By matching corresponding terms in expressions (7) and (9) it can be seen that the active inductor free implementation of FIG. 3 has the same filter order as the second order LC topology.

Simulations on a FET-based 1 GHz oscillator have indeed shown that the new phase shift filter of FIG. 2 has higher-order filter properties. The results of the simulations are schematically illustrated in FIGS. 4 and 5.

Figure 4:
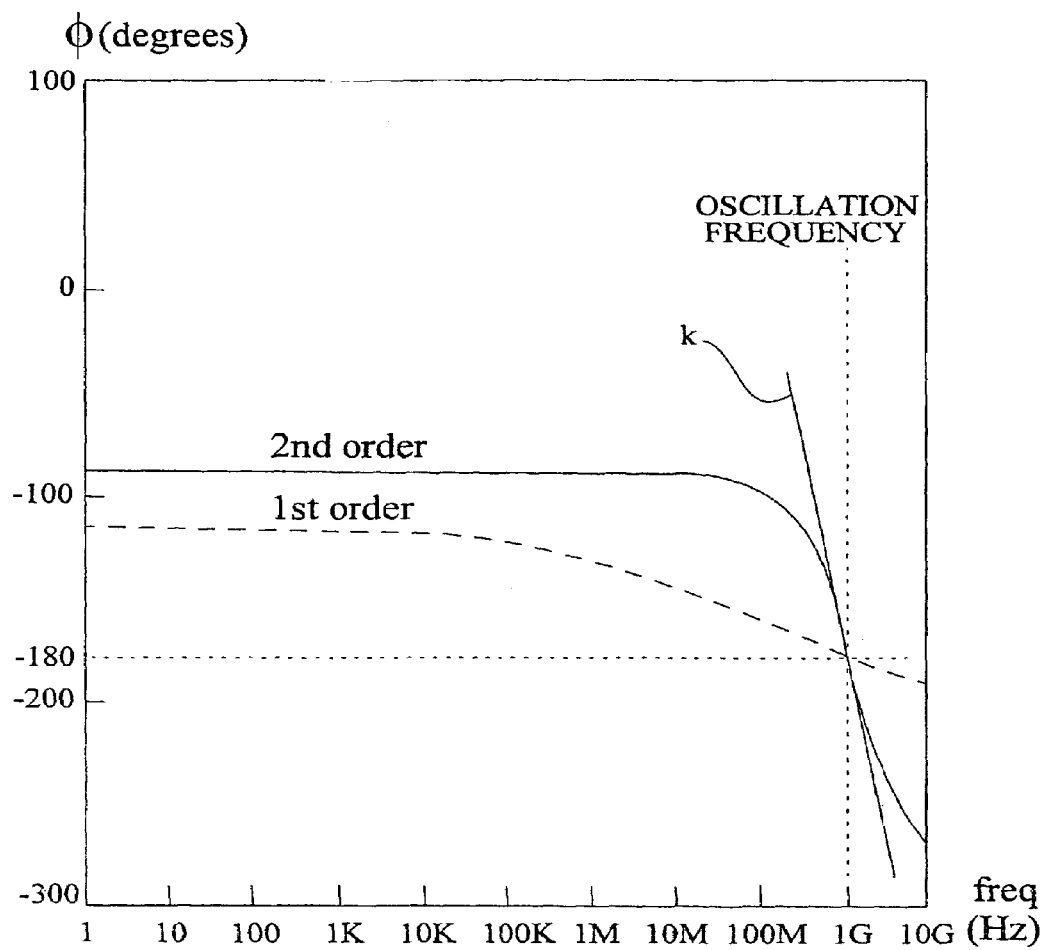
FIG. 4 is a schematic diagram illustrating the frequency-dependent phase shift function of the phase shift filter of FIG. 2.
Figure 5:
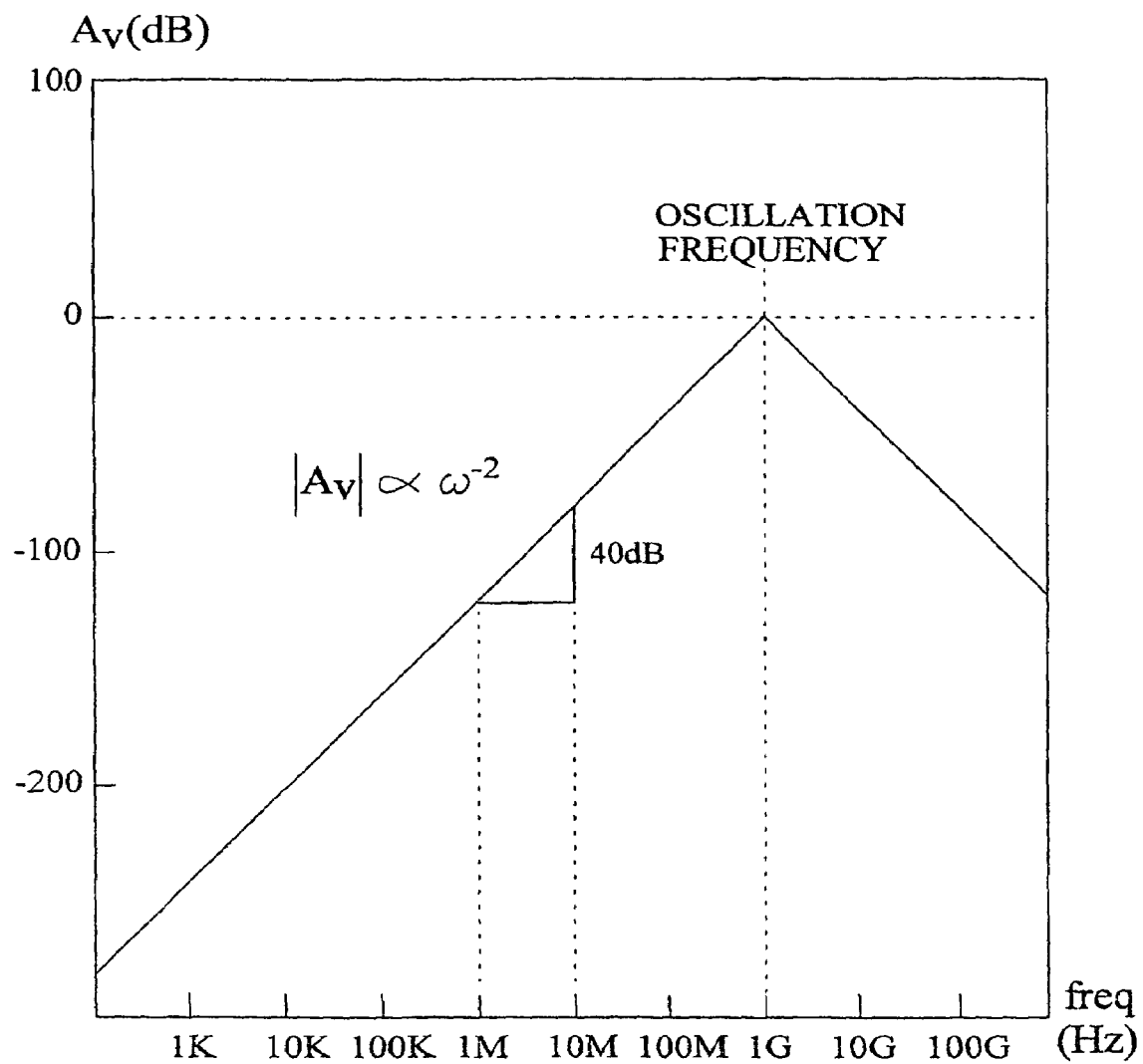
FIG. 5 is a schematic diagram illustrating the frequency-dependent amplitude function of the phase shift filter of FIG. 2.

FIG. 4 is a schematic diagram illustrating the frequency-dependent phase shift function of the phase shift filter of FIG. 2. The phase shift function of the phase shift filter according to the invention is depicted by a solid line as a second order function, whereas the phase shift function of a simple first order filter is depicted by a dashed line. The second-order phase shift function of the invention experiences an abrupt change in phase shift when the frequency deviates slightly from the desired oscillation frequency. This generally means that only those frequency components that are very close to the desired oscillation frequency fulfil the necessary oscillation conditions, thereby improving the phase stability and frequency selectivity of the oscillator. The second order properties of the phase shift filter is generally manifested by a large frequency derivative $$k = \frac{d\phi}{d\omega}$$

at the oscillation frequency, which naturally translates into a corresponding large quality value Q:

$$Q = \frac{\omega_0}{2}\frac{d\phi}{d\omega}\bigg|_{\omega=\omega_0} \qquad (10)$$

The internal feedback loop thus effectively provides a second order filter function, replacing tricky resonator-based low-quality components.

As can be seen from the amplitude frequency response shown in FIG. 5, a band-pass filter response with a 40 dB/decade attenuation roll-off both for higher and lower frequencies can be obtained.

For a more complete understanding of the invention, the filter-order enhancing feedback loop will now be described in relation to a particular realization example of an oscillator feedback system.

Figure 6:
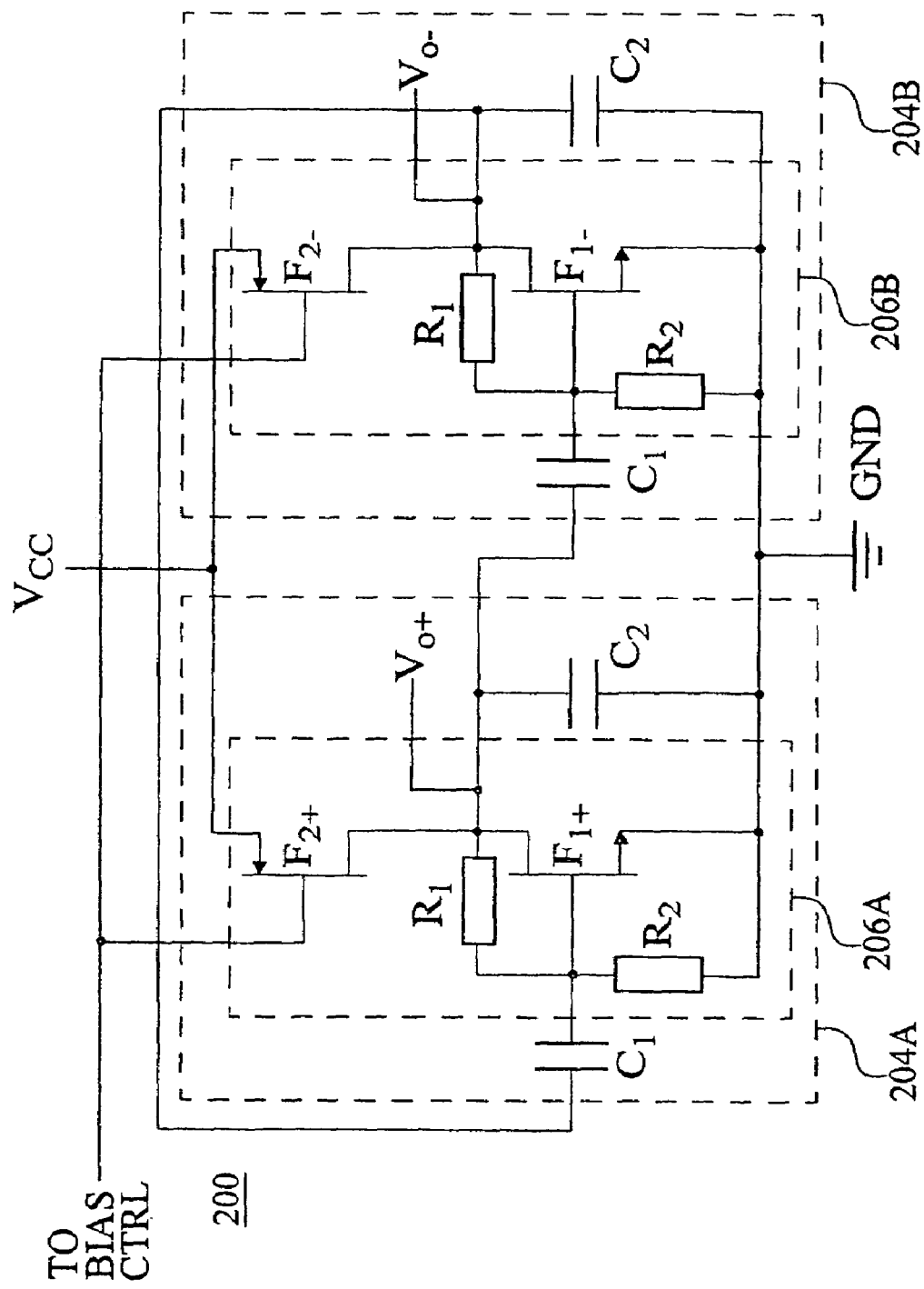
FIG. 6 is a schematic circuit diagram of a double-stage ring-topology oscillator based on phase shift filters according to a preferred embodiment of the invention.

FIG. 6 is a schematic circuit diagram of a ring-topology oscillator based on phase shift filters according to a preferred embodiment of the invention. The oscillator 200 basically comprises two active phase shift filters 204A, 204B connected in a ring topology. Each phase shift filter 204A/204B is based on an inverting common-source amplifier 206A/206B with internal feedback for providing second order phase shift filtering. Advantageously, the internal filter-order enhancing feedback of the common-source amplifier is purely resistive $R_1$ for reduced complexity. In this realization, the common-source amplifiers have active p-MOS loads, which are connected to conventional circuitry for bias control to set the DC currents. Each of the phase shift filters 204A/204B further comprises an input capacitor $C_1$ blocking the input of the inverting amplifier 206A/206B, and an output capacitor $C_2$ shunting the output of the inverting amplifier to ground, thus forming a lead-and lag filter network.

To obtain a higher gain, especially when considering a CMOS implementation with common-source amplifiers using active loads, several such feedback-enhanced amplifier stages (an odd number to maintain the inverting action) may be utilized in a cascaded chain. High operating frequencies can be achieved with moderate power consumption since each phase shift filter will have both a lead and a lag function, and may thus compensate for propagation delay and the associated phase shift in the cascaded amplifier chain. Careful dimensioning of the internal feedback loop prevents any spurious oscillation, especially if a high-gain, low-impedance feedback scheme is utilized.

Figure 7:
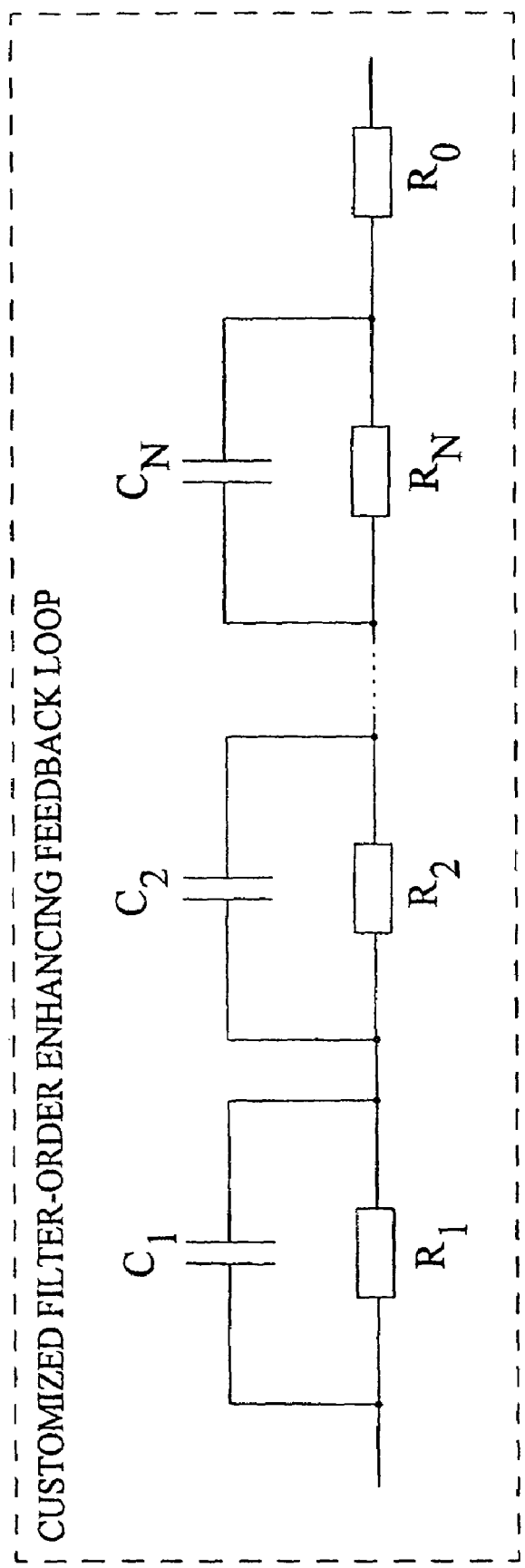
FIG. 7 is a schematic diagram of a filter-order enhancing feedback loop with the possibility of customized, application-specific frequency response.

As an alternative to a purely resistive filter-order enhancing feedback loop, the feedback loop may be customized for a specific application by replacing the feedback resistor by a series/parallel connection of segmented reactive blocks. In the limit, a lumped element is replaced by a segmented frequency dependent combination of atomic blocks, giving an almost continuous function of frequency if several blocks are used. An example of such a segmented feedback arrangement will now be described with reference to FIG. 7. The feedback loop of FIG. 7 comprises a series connection of segmented parallel RC-networks $R_1//C_1, R_2//C_2, \ldots, R_N//C_N$ and a base resistor $R_0$.

Each resistor is bypassed (low ohmic) by the corresponding capacitor above an individually set corner frequency $f_n$ given by $f_n=1/(2\pi R_n C_n)$. By using this fact, it is possible to segment a given total resistance $R=R_1+R_2+\ldots+R_N$ such that the operational resistance of the filter-order enhancing feedback loop changes from a maximum value to a minimum value over an arbitrary curve form when the frequency increases. The resistance and capacitance values can be selected freely, and in analogy with the mathematical Taylor expansion of an arbitrary function using a polynomial base, the incremental analysis of the distributed internal feedback yields that any type of low-pass or band-pass filtering function may be implemented using the presented algorithm.

Here, the main benefits are that the high frequency gain is lowered and the roll-off at higher frequencies is increased by the capacitive short circuit of the input and output nodes. In addition, the DC bias of the feedback loop is simplified since the base load of $R_0$ is not restricted to low values to obtain the desired oscillation frequency.

The invention is equally applicable to oscillators with more than one oscillator feedback system. In the following, the invention will be described with reference to a differential oscillator that is based on two oscillator feedback systems interconnected by one or more common phase shifting links.

Figure 8:
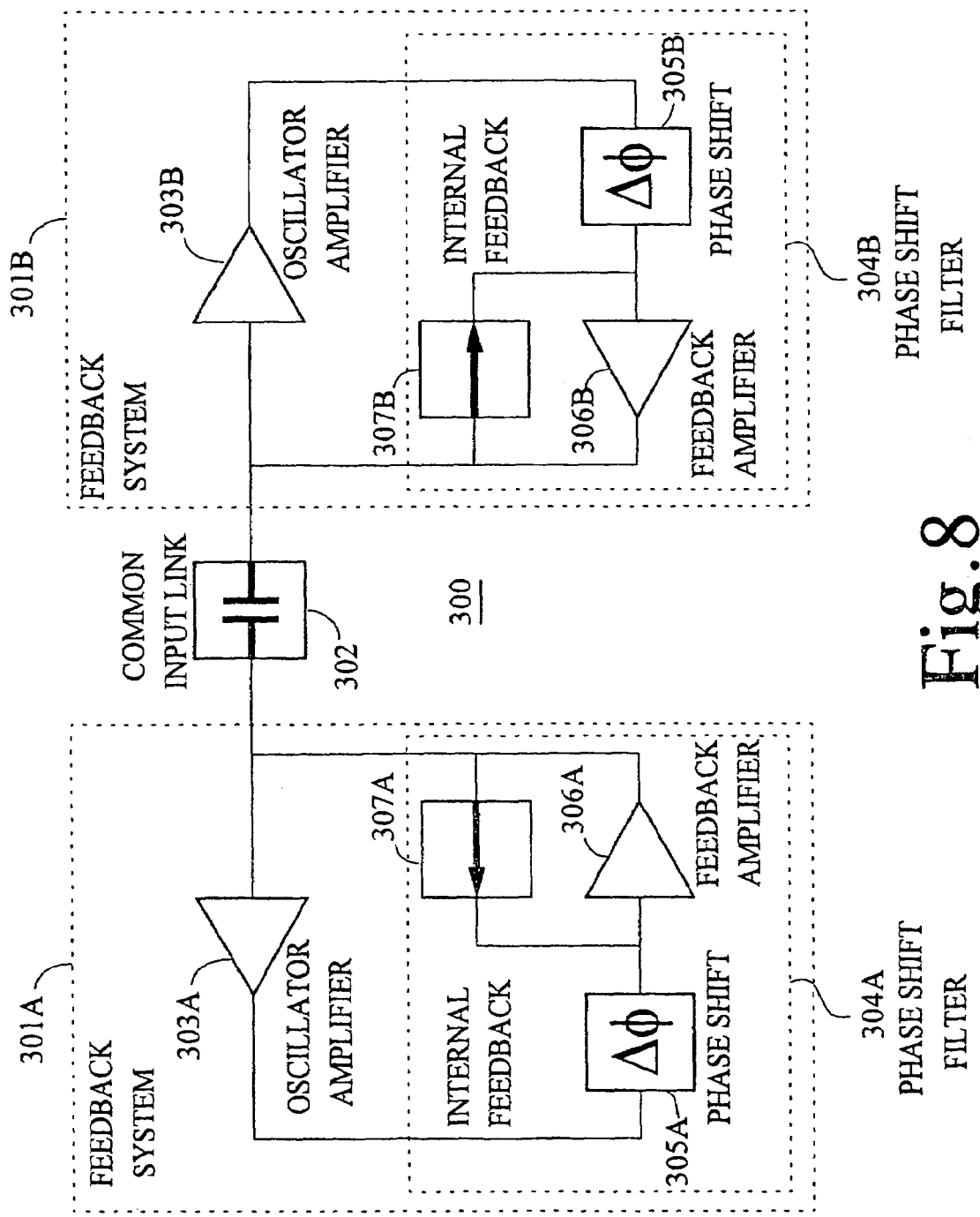
FIG. 8 is a conceptual high-level block diagram illustrating an oscillator based on two interconnected oscillator feedback systems according to a preferred embodiment of the invention.

FIG. 8 is a conceptual high-level block diagram illustrating an oscillator based on two properly interconnected oscillator feedback systems according to a preferred embodiment of the invention.

Basically the differential oscillator 300 comprises two oscillator feedback systems 301A, 301B interconnected by a common capacitive phase shifting link 302.

In operation, the common phase shifting link 302 cooperates with systems 301A, 301B to enable self-sustained differential oscillation. The interconnecting capacitive link 302 completes the differential oscillator essentially formed by the two local oscillator feedback systems. The two ideally identical feedback systems 301A and 301B operate, together with the common phase shifting link 302, effectively in anti-phase with respect to each other as two separate oscillator halves joined by a common connection.

Each local oscillator feedback system comprises an oscillator amplifier 303A/303B and a phase shift filter 304A/304B. Each phase shift filter 304A/304B includes a phase shift function 305A/305B and a feedback amplifier 306A/306B. In practical realizations however, the phase shift function and the feedback amplifier are advantageously integrated, as will be described below with reference to FIG. 10. It is also convenient to use an inverting feedback amplifier and introduce an appropriate degree of phase shift in the phase shift filter.

It is clear that the local oscillator feedback systems should be configured in such a manner that each local feedback path has a significant phase shift when they are isolated from each other. However, self-sustained oscillation in each local oscillator feedback system requires in-phase feedback, which is clearly not present when the local feedback systems are separated. Therefore, the common phase shifting link is required for interconnecting the two oscillator feedback systems. However, it is important that the common link is arranged in such a way that the required zero phase shift condition is met only when the two local feedback systems operate in antiphase with respect to each other, i.e. for differential excitation.

Figure 9:
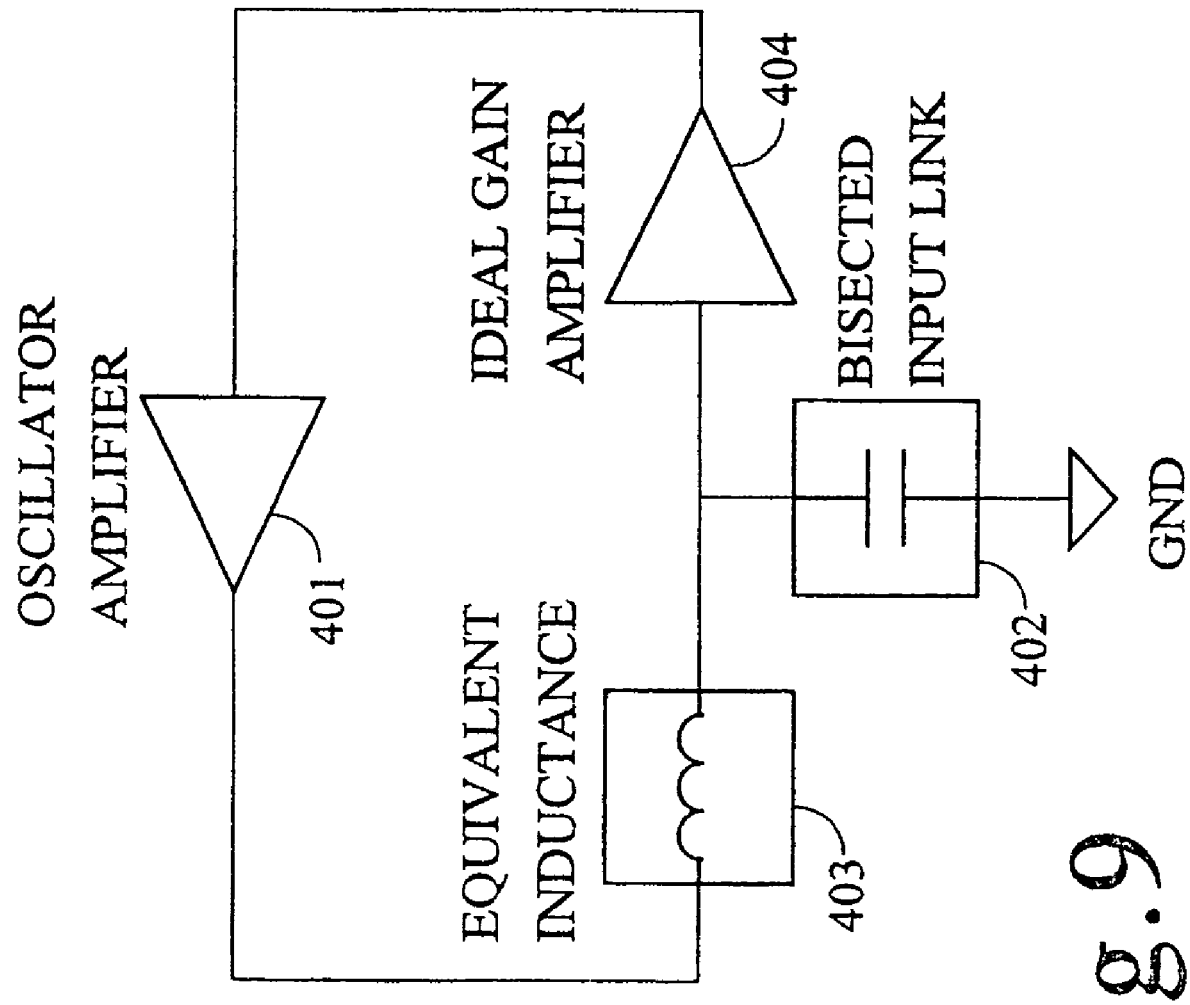
FIG. 9 is an ideal equivalent bisected model of the oscillator of FIG. 8 illustrating the desired operation during differential mode excitation.

In order to provide higher order phase shift filtering, each feedback amplifier is provided with its own internal feedback loop 307A/307B. In this way, as it has turned out, the local feedback systems will experience an abrupt change in phase shift when the frequency deviates slightly from the desired oscillation frequency, thereby strongly attenuating signal components with frequencies other than the ideal oscillation frequency. In fact, it can be shown that the introduction of an internal feedback loop in the oscillator feedback systems, the same phase shifting properties as a second order LC filter can be obtained, but without having to use low-quality inductive elements. The desired operation during differential mode excitation is schematically illustrated in FIG. 9, which is an ideal equivalent bisected model of the oscillator of FIG. 8 when the feedback amplifiers are provided with internal filter-order enhancing feedback loops. In essence, according to the bisection theorem, the equivalent model of FIG. 9 illustrates one half of the overall oscillator with a bisected common capacitive link. The feedback path from output to input of the oscillator amplifier 401 is represented by an equivalent inductance 403 and an ideal gain amplifier 404 for providing the necessary voltage transformation. The equivalent inductance 403(L) cooperates with the bisected capacitive link 402(C), thus fulfilling Barkhaussen's criteria of zero total phase shift (and unity loop gain) for the overall oscillator circuit.

Figure 10:
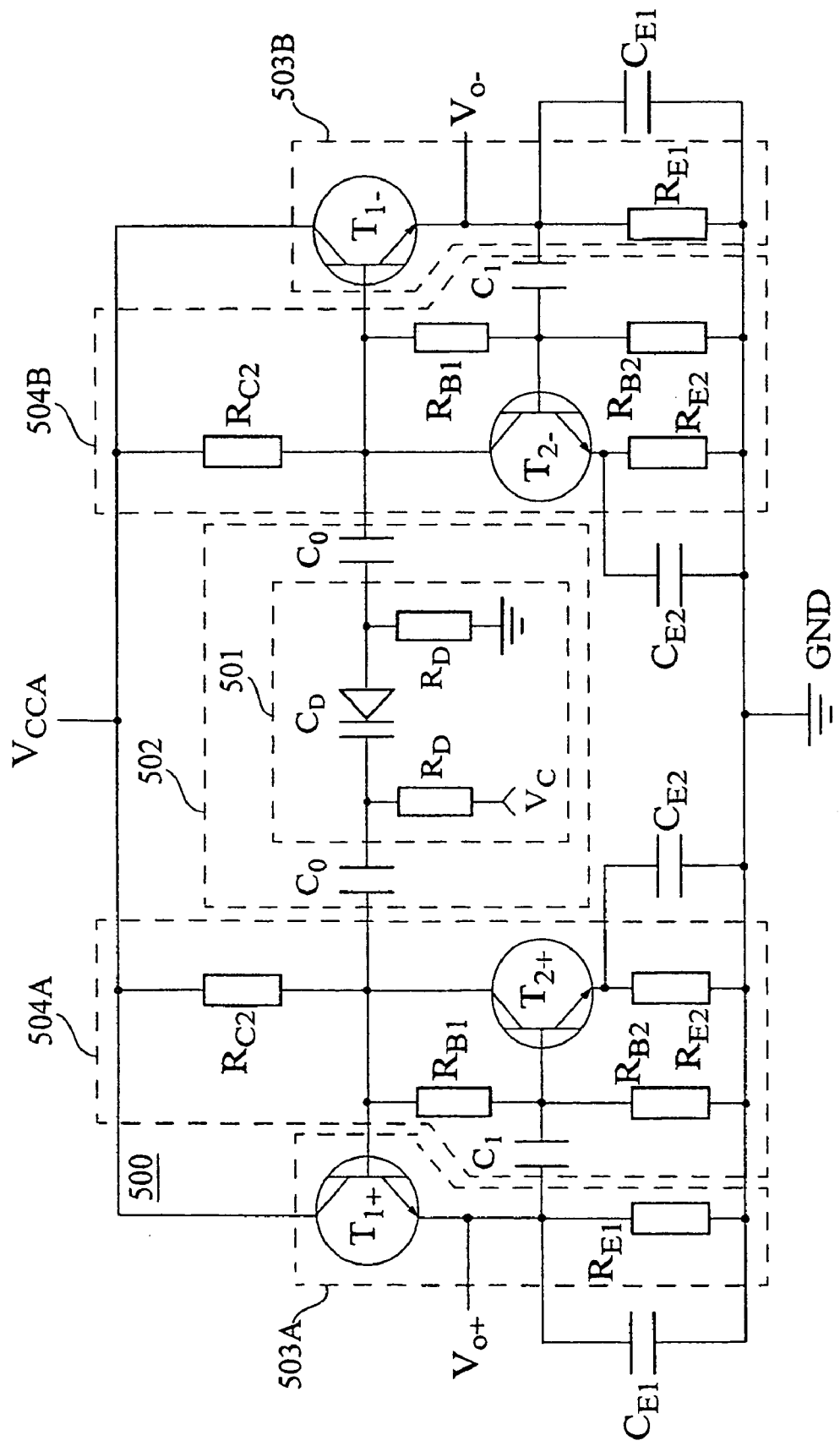
FIG. 10 is a detailed circuit diagram of a differential oscillator based on the high-level block diagram of FIG. 8.

FIG. 10 is a detailed circuit diagram of a differential oscillator based on the high-level block diagram of FIG. 8. The differential oscillator 500 comprises two branches interconnected by a common capacitive link 502. In this realization, each of the local feedback systems includes an emitter-follower based oscillator amplifier 503A/503B and a phase shift filter 504A/504B. The phase shift filter 504A/504B comprises an inverting feedback amplifier with an embedded capacitive phase shift function. Preferably, the phase shift originates from the inverting feedback amplifier together with the phase shift filter capacitor $C_1$. In addition, by introducing an emitter-decoupling capacitor $C_{E1}$ for each emitter-follower based oscillator amplifier 503A/503B, an integrating function is incorporated into the feedback system. In practice, the emitter-decoupling capacitor $C_{E1}$ forms an additional capacitive phase shifting element. The resistance $R_{B1}$ is used as the internal feedback element of the inverting amplifier to provide a second order frequency response for the phase shift function.

The resistance $R_{C2}$ has a biasing effect at the same time as it sets the gain of the inverting amplifier, and the capacitance $C_{E2}$ ensures that the inverting amplifier has maximum gain.

The differential oscillator 500 may be realized with and without tuning. In this example, varactor-based tuning 501 is shown as a default mechanism. Alternatively, however, the feedback-enhanced inverting amplifier stages may have a common emitter bias circuit in the form of a tunable current source (not shown). In such a case, the tuning is basically effectuated by changing the quiescent current of the current source.

Although not explicitly shown in FIG. 10, the oscillator may also include circuitry for crystal or SAW oscillation enhancement. Also, the oscillator amplifier stages may have a common constant current source.

In order to complete the circuit design for any specific application or IC process, it is recommended to perform extensive simulations such as SPICE simulations together with extraction of parasitics from the actual layout. In the design work, frequency properties of the local feedback systems are best studied under open loop conditions, i.e. with the oscillator amplifier disconnected from the local feedback path.

Figure 11:
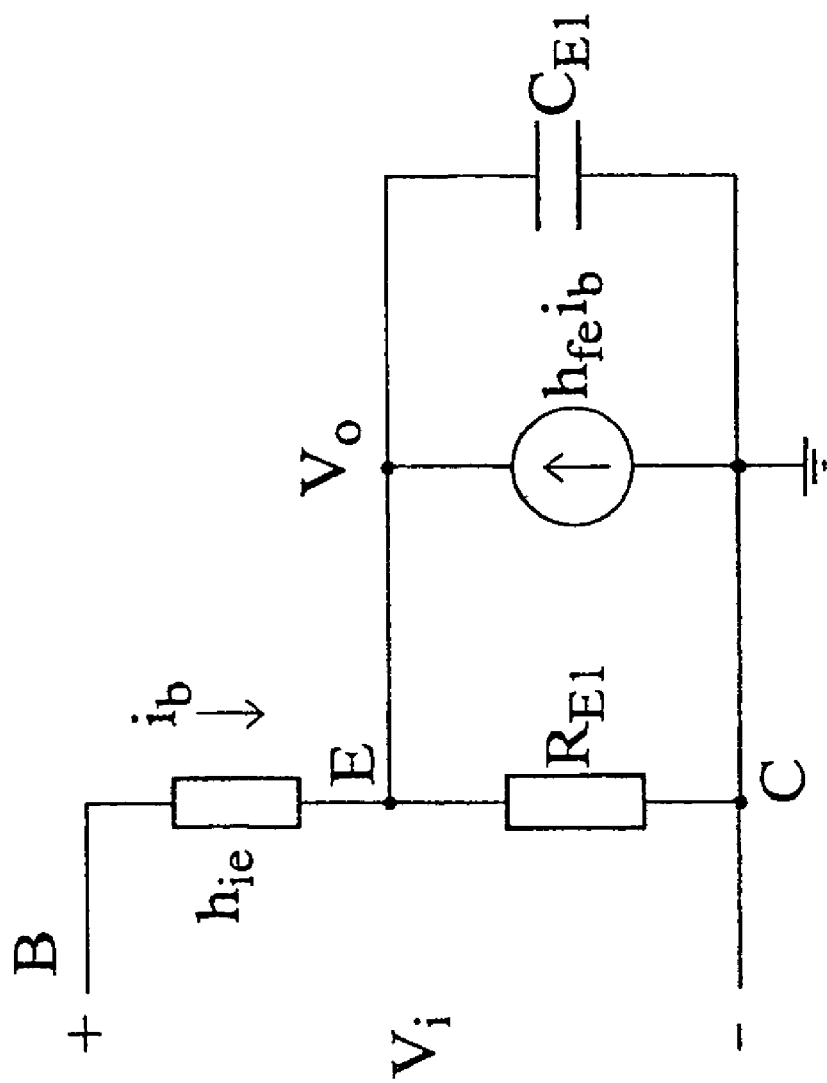
FIG. 11 is a schematic mid-frequency small signal AC electrical equivalent model of the emitter-follower based integrator/oscillator amplifier of FIG. 10.

FIG. 11 is a schematic mid-frequency small signal AC electrical equivalent model of the emitter-follower based integrator/oscillator amplifier of FIG. 10. The emitter-follower is capacitively loaded with the capacitor $C_{E1}$ to form a phase shifting integrator. Referring to FIG. 11, the base current $i_b$ is equal to:

$$i_b = \frac{V_i - V_o}{h_{ie}} \quad (11)$$

Applying Kirchoff's current summation law at the emitter node (E):

$$i_b + h_{fe} \cdot i_b = \frac{V_o}{R_{EI}} + \frac{V_o}{1/sC_{EI}} \quad (12)$$

where $h_{fe}$, is the small signal current gain, and the reactance is represented in the Laplace domain.

Using expression (11) in (12) gives:

$$\frac{V_i - V_o}{h_{ie}} \cdot (1 + h_{fe}) = \frac{V_o}{R_{EI}} \cdot (1 + sR_{EI}C_{EI}) \quad (13)$$

where $h_{ie}$ is the base-emitter impedance, and $(1+h_{fe}) \approx h_{fe}$.

The transfer function $F_i(s)$ which is defined as the ratio of $V_o$ and $V_i$ can then be expressed as:

$$F_i(s) = \frac{V_o}{V_i} = \frac{\frac{h_{fe}}{h_{ie}} \cdot \left[R_{EI} \middle\| \left(\frac{h_{ie}}{h_{fe}}\right)\right]}{1 + s\left[R_{EI} \middle\| \left(\frac{h_{ie}}{h_{fe}}\right)\right]C_{EI}} = \frac{D_E}{1 + s\tau_E} \quad (14)$$

where $D_E$ is the buffer amplifier damping and $\tau_E$ is the equivalent low-pass filter time constant.

In the frequency domain $s = j\omega$. Accordingly:

$$F_i(\omega) = \frac{D_E}{1 + j\omega\tau_E} \quad (15)$$

The phase shift $\phi$ from input to output, i.e. the "phase retard", is equal to:

$$\phi_i = \arg[F_i(j\omega)] = -\arctan[\omega\tau_E] = -\arctan\left[\frac{\omega}{\omega_E}\right] \quad (16)$$

with corner frequency:

$$f_E = \frac{\omega_E}{2\pi} = \frac{1}{2\pi\left[R_{EI} \middle\| \frac{h_{ie}}{h_{fe}}\right]C_{EI}} \quad (17)$$

It can thus be seen that it is possible to obtain a phase shift between 0° and −90° depending on the combination of emitter-decoupling resistor ($R_{E1}$) and capacitor ($C_{E1}$). In the limiting case, the integrator gives an ideal phase shift of −90°.

Figure 12:
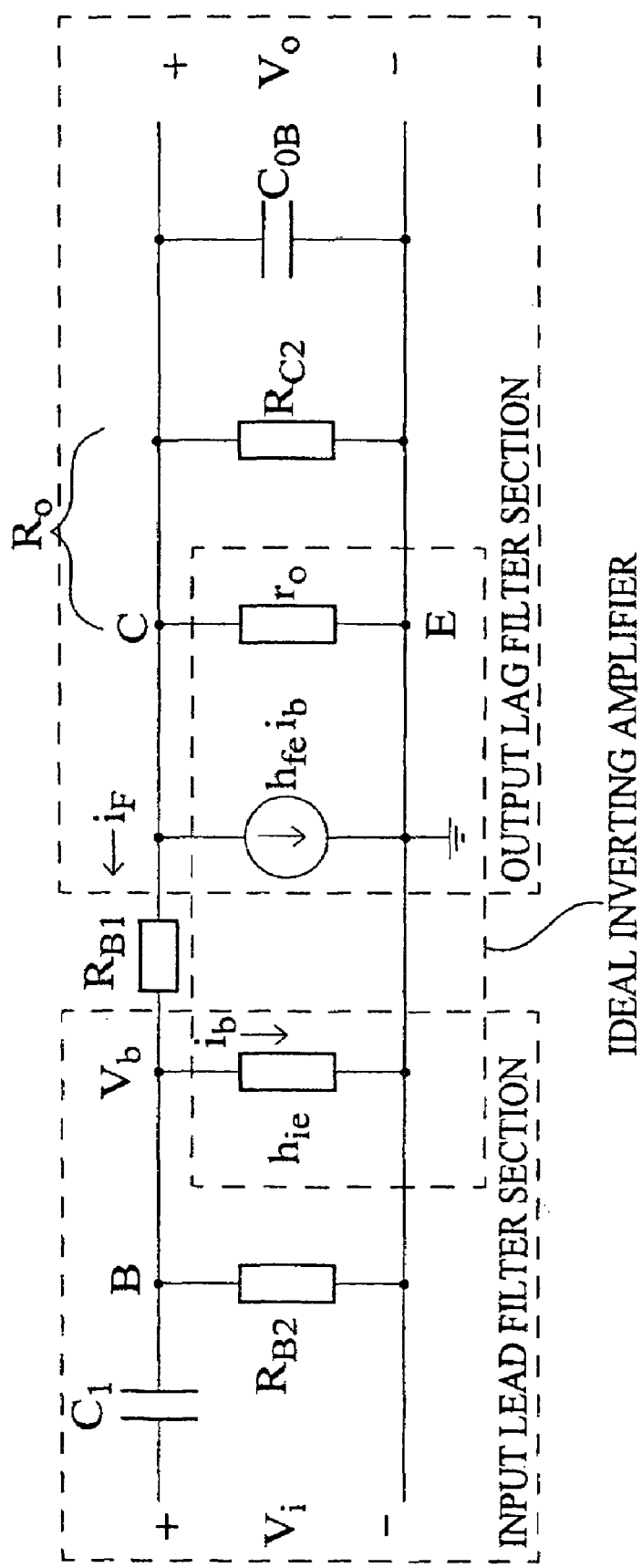
FIG. 12 is a schematic mid-frequency small signal AC electrical equivalent model of the inverting amplifier based feedback network of FIG. 10, including the bisected common capacitive link.

FIG. 12 is a schematic mid-frequency small signal AC electrical equivalent model of the inverting amplifier based feedback network of FIG. 10, including the bisected common capacitive link. In the equivalent model, the feedback network can be seen as formed around an ideal inverting amplifier with an input lead filter on one side and an output lag filter integrator on the other side, interconnected by an internal feedback resistor.

Applying Kirchoff's current summation law at the base node (B):

$$(V_i - V_b)sC_1 + i_F = \frac{V_b}{R_{B2}} + i_b \quad (18)$$

where $V_b$ is the base voltage potential. The base current $i_b$ is defined as:

$$i_b = \frac{V_b}{h_{ie}} \quad (19)$$

where $h_{ie}$ is the base-emitter impedance. The feedback current $i_F$ is given by:

$$i_F = \frac{V_o - V_b}{R_{B1}} \quad (20)$$

The expressions (18)–(20) give the following expression:

$$V_i sC_1 = -\frac{V_o}{R_{B1}} + V_b \cdot \left[\frac{1}{R_{B2}} + \frac{1}{R_{B1}} + \frac{1}{h_{ie}} + sC_1\right] \quad (21)$$

Applying Kirchoff's current summation law at the collector node (C):

$$i_F + h_{fe} \cdot i_b + \frac{V_o}{R_o} + sC_{0B} \cdot V_o = 0 \quad (22)$$

where $h_{fe}$ is the small signal current gain, $C_{OB}$ is the bisected capacitance from the common link and $R_o$ is the parallel combination of output loads (including the transistor output impedance $r_o$). Using expressions (19) and (20) in (22) gives:

$$\frac{V_o - V_b}{R_{BI}} + h_{fe} \cdot \frac{V_b}{h_{ie}} + \frac{V_o}{R_o} + sC_{OB} \cdot V_o = 0 \quad (23)$$

$$\Rightarrow V_b = V_o \cdot \frac{\frac{1}{R_o} + \frac{1}{R_{BI}} + sC_{OB}}{-\frac{h_{fe}}{h_{ie}} + \frac{1}{R_{BI}}} \quad (24)$$

Now, using expression (24) in (21) gives the transfer function $F_{fA}(s)$ for the feedback amplifier based phase shift filter in combination with the bisected common capacitive link:

$$F_{fA}(s) = \frac{V_o}{V_i} = \frac{\left(-\frac{h_{fe}}{h_{ie}} + \frac{1}{R_{BI}}\right)sC_1}{-\frac{1}{R_{BI}}\left(-\frac{h_{fe}}{h_{ie}} + \frac{1}{R_{BI}}\right) + \left(\frac{1}{R_{B2}} + \frac{1}{R_{BI}} + \frac{1}{h_{ie}} + sC_1\right)\left(\frac{1}{R_o} + \frac{1}{R_{BI}} + sC_{OB}\right)} \quad (25)$$

Note that in order to provide sufficient voltage gain, the feedback must have high impedance:

$$R_{BI} \gg \frac{h_{ie}}{h_{fe}} \quad (26)$$

The transfer function $F_{fA}(\omega)$ in the frequency domain is given by:

$$F_{fA}(\omega) = \frac{V_o}{V_i} = \frac{\left(-\frac{h_{fe}}{h_{ie}} + \frac{1}{R_{BI}}\right)j\omega C_1}{-\frac{1}{R_{BI}}\left(-\frac{h_{fe}}{h_{ie}} + \frac{1}{R_{BI}}\right) + \left(\frac{1}{R_{B2}} + \frac{1}{R_{BI}} + \frac{1}{h_{ie}} + j\omega C_1\right)\left(\frac{1}{R_o} + \frac{1}{R_{BI}} + j\omega C_{OB}\right)} \quad (27)$$

The overall phase shift provided by the transfer function is defined by subtracting the phase shift of the denominator from the phase shift of the numerator. By analyzing expression (27) it can be seen that a phase shift of $-90°$ is supplied by the numerator. The integrator formed by the capacitively decoupled oscillator buffer analyzed in connection with FIG. 11 introduces an additional phase shift of down to $-90°$. In a particular implementation, part of this phase shift may already be present due to parasitic phase shifts at high frequency. Properly dimensioned, the denominator contributes with the additional required phase shift of $-180°$. The term $$-\frac{1}{R_{BI}}\left(-\frac{h_{fe}}{h_{ie}} + \frac{1}{R_{BI}}\right)$$

is positive and is usually negligible. If $$\omega C_1 \gg \frac{1}{R_{B2}} + \frac{1}{R_{BI}} + \frac{1}{h_{ie}} \text{ and } \omega C_{OB} \gg \frac{1}{R_o} + \frac{1}{R_{BI}},$$

which corresponds to large capacitance values and/or a high operating frequency, the denominator reduces to (in the limiting case):

$$(j\omega C_{OB}) \cdot (j\omega C_1) = -\omega^2 C_{OB} C_1 \quad (28)$$

which is equivalent to a phase shift of $-180°$. In summary, it can be seen that $\arg[V_o] - \arg[V_i]$ varie between $-180°$ and $+90°$. In the upper limiting case, $\arg[V_o] - \arg[V_i] = -90° - (-180°) = +90°$, which is balanced out by the additional phase shift of $-90°$ introduced by the capacitively decoupled buffer integrator analyzed in connection with FIG. 11. Thus, Barkhaussen's criterion of zero total phase shift is fulfilled. However, it should be understood that it is more practical to realize the required phase shift using more than one phase shifting integrator link in the overall feedback network, avoiding the limiting case, as will be described below in connection with FIG. 13. It is apparent that it is easier to use several phase shifting links, each of which is optimized towards a target phase shift far away from the limiting case.

For the overall oscillator operation, it is of fundamental importance to utilize the common link in such a manner that a significant additional phase shift is provided only for differential signals and substantial common mode suppression is achieved. Another important objective is to operate the respective phase shift filters well apart from zero phase shift to reduce the probability of high or low frequency spurious oscillations. A significant phase shift well apart from zero will dominate over any parasitic phase shifts and the frequency-dependent phase shift of the wide-band oscillator buffer amplifiers. In this way, the number of active elements in the circuit design can be minimized while at the same time optimizing the phase shift as a function of the frequency of the overall oscillator feedback network.

It should be understood that there are various types of phase shifting links or filters that can be utilized and/or combined in the oscillator to fulfill Barkhaussen's criteria of sustainable oscillation. For example, both differentiating and integrating phase shifting links can be incorporated in the inverting amplifier and embedded phase shift filter. For general information on various phase shifting links in oscillators, reference is made to U.S. Pat. Nos. 4,571,558 and 4,646,033, which are incorporated herein by reference.

The performance characteristics of the proposed frequency selective feedback networks is analyzed by introducing a reference topology in form of a simple second order LC filter with known performance properties, and comparing the two topologies. By using a known reference topology, it is possible to analyze the more complex feedback network topology of FIG. 10 without explicit calculations by matching corresponding terms in the phase shift functions.

The reference topology is selected as a second order LC filter configured as a voltage divider formed by a capacitive element C and an inductive element L with a loss resistance R.

The transfer function $F_{LC}(\omega)$ of the LC filter is given by:

$$F_{LC}(\omega) = \frac{1}{(1-\omega^2 LC) + j\omega RC} \equiv \frac{1}{(1-m_{LC}) + jn_{LC}} \quad (29)$$

It can be derived that the Q-value for the LC filter with the transfer function $F_{LC}(\omega)$ is given by:

$$Q_{LC} = \frac{\omega L}{R} = \frac{\omega^2 LC}{\omega RC} = \frac{m_{LC}}{n_{LC}} \quad (30)$$

Presenting the transfer function $F_{fA}(\omega)$ given in (27) in more compact form:

$$F_{fA}(\omega) = \frac{\left(-\frac{h_{fe}}{h_{ie}} + \frac{1}{R_{BI}}\right)j\omega C_1}{\underbrace{-\frac{1}{R_{BI}}\left(-\frac{h_{fe}}{h_{ie}} + \frac{1}{R_{BI}}\right)}_{k_1} + \left(\underbrace{\frac{1}{R_{B2}} + \frac{1}{R_{BI}} + \frac{1}{h_{ie}}}_{k_2} + \underbrace{j\omega C_1}_{jk_3}\right)\left(\underbrace{\frac{1}{R_o} + \frac{1}{R_{BI}}}_{k_4} + \underbrace{j\omega C_{0B}}_{jk_5}\right)} \quad (31)$$

$$= \frac{jk_0}{k_1 + (k_2 + jk_3)(k_4 + jk_5)}$$

$$= \frac{jk_0}{k_1 + k_2k_4 - k_3k_5 + j(k_2k_5 + k_3k_4)}$$

Bringing expression (31) into conformity with expression (29):

$$F_{fA}(\omega) = \frac{jk_0}{k_1 + k_2k_4 - k_3k_5 + j(k_2k_5 + k_3k_4)} \quad (32)$$

$$= \frac{\frac{jn_0}{jk_0}}{\frac{k_1 + k_2k_4}{1 - \underbrace{\frac{k_3k_5}{k_1 + k_2k_4}}_{m_{fA}} + j\underbrace{\left(\frac{k_2k_5 + k_3k_4}{k_1 + k_2k_4}\right)}_{n_{fA}}}}$$

$$= \frac{jn_0}{1 - m_{fA} + jn_{fA}}$$

By comparing the denominators of $F_{LC}(\omega)$ in (29) and $F_{fA}(\omega)$ in (32) and in analogy with expression (30) it can be seen that the Q-value of the frequency selective feedback network of the proposed oscillator can be estimated as:

$$Q_{fA} = \frac{m_{fA}}{n_{fA}} \quad (33)$$

From expressions (31) and (32) above it can be readily seen that the filter response is of second order:

$$m_{fA} \propto k_3 k_5 = \omega^2 C_1 C_{OB} \propto \omega^2 \quad (34)$$

Apparently, a higher-order filter can be achieved by arranging an internal feedback loop around the active element in the phase shift filter, without using inductive elements as in the LC filter topology. This is a great advantage, since a high Q-value can be obtained without being limited by the internal losses of the inductive element. Other significant improvements include reduced area and IC process requirements, reduced magnetic coupling due to absence of an explicit resonator, and possibility to increase the operating frequency.

As mentioned earlier, working close to the limiting case for realizing significant phase shifts is difficult and normally introduces excessive attenuation when using only a single phase shifting integrator link. A more convenient way to realize the required phase shift is to introduce multiple cascaded amplifier-based phase shift filters, each of which contributes with a small phase shift increment. This increases the design flexibility and relaxes the gain and phase shift requirements on each phase shifting block. With such an arrangement, the mandatory phase shift condition is met without serious degradation of the saturated amplitude, thus increasing the signal-to-noise ratio, even when the effect of introducing the additional active elements is taken into account. In this respect, it its also advisable to use several common phase shifting links interconnecting corresponding terminals in the local feedback paths to improve the differentiality even further.

Figure 13:
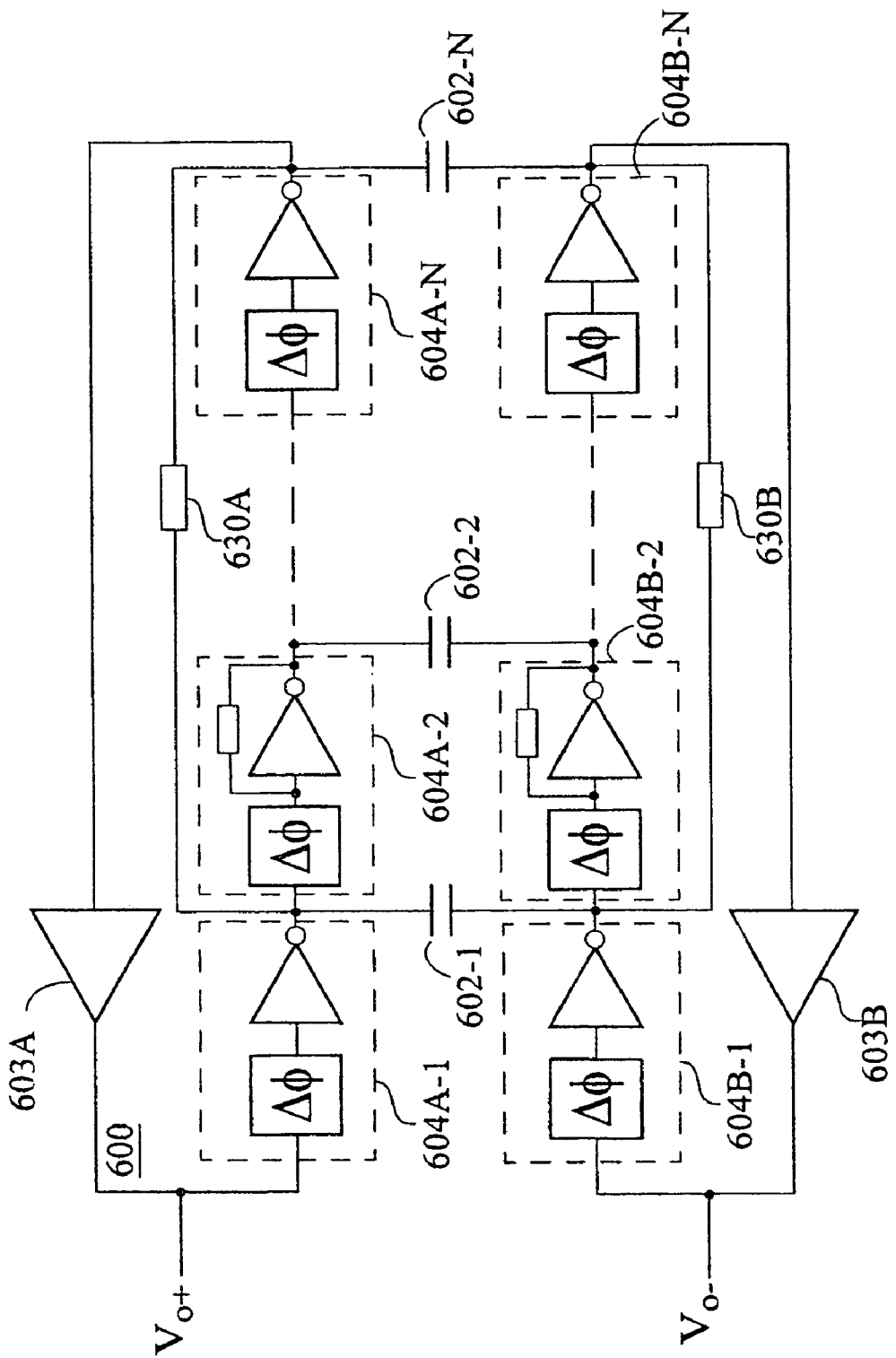
FIG. 13 is a schematic circuit diagram of a differential oscillator implementation incorporating multiple cascaded phase shift filters.

FIG. 13 is a schematic circuit diagram of a differential oscillator implementation incorporating multiple cascaded phase shift filters. In similarity to the embodiments of FIGS. 8 and 10, the oscillator 600 is based on two interconnected local oscillator feedback systems. Each local feedback system comprises an oscillator amplifier 603A/603B having a local feedback path. In this implementation however, each local feedback path includes several phase shift filters or phase shifting blocks 604A-1 to 604A-N/604B-1 to 604B-N. The phase shift filters may be based on inverting and non-inverting feedback amplifiers with additional phase shift elements in various combinations. The feedback amplifiers are provided with their own internal filter-order enhancing feedback loop, and it is even possible to arrange filter-order enhancing feedback loops 630A/630B between different phase shift filters in the local feedback paths to enable higher-order phase shift filtering.

In the case of using phase shift filters based on inverting amplifiers, it is recommendable to utilize an odd number of phase shift filters or blocks in each local feedback path to ensure negative feedback for low frequencies, thereby obtaining strong suppression of low-frequency spurious oscillations. This is similar to the properties of conventional cross-coupled feedback, but without the drawbacks of high-impedance loading. Preferably, the local feedback systems are interconnected by several common phase shifting links 602-1 to 602-N. Each common phase shifting link provides a connection between points in the two local feedback systems that are in antiphase with respect to each other. In this way, symmetry is maintained and proper differential excitation of the common links is ensured. This gives a significant difference in loop phase shift when the two local feedback systems are working in antiphase, i.e. differential excitation, compared to the unwanted situation when both systems are working in phase, i.e. common mode excitation.

Figure 14:
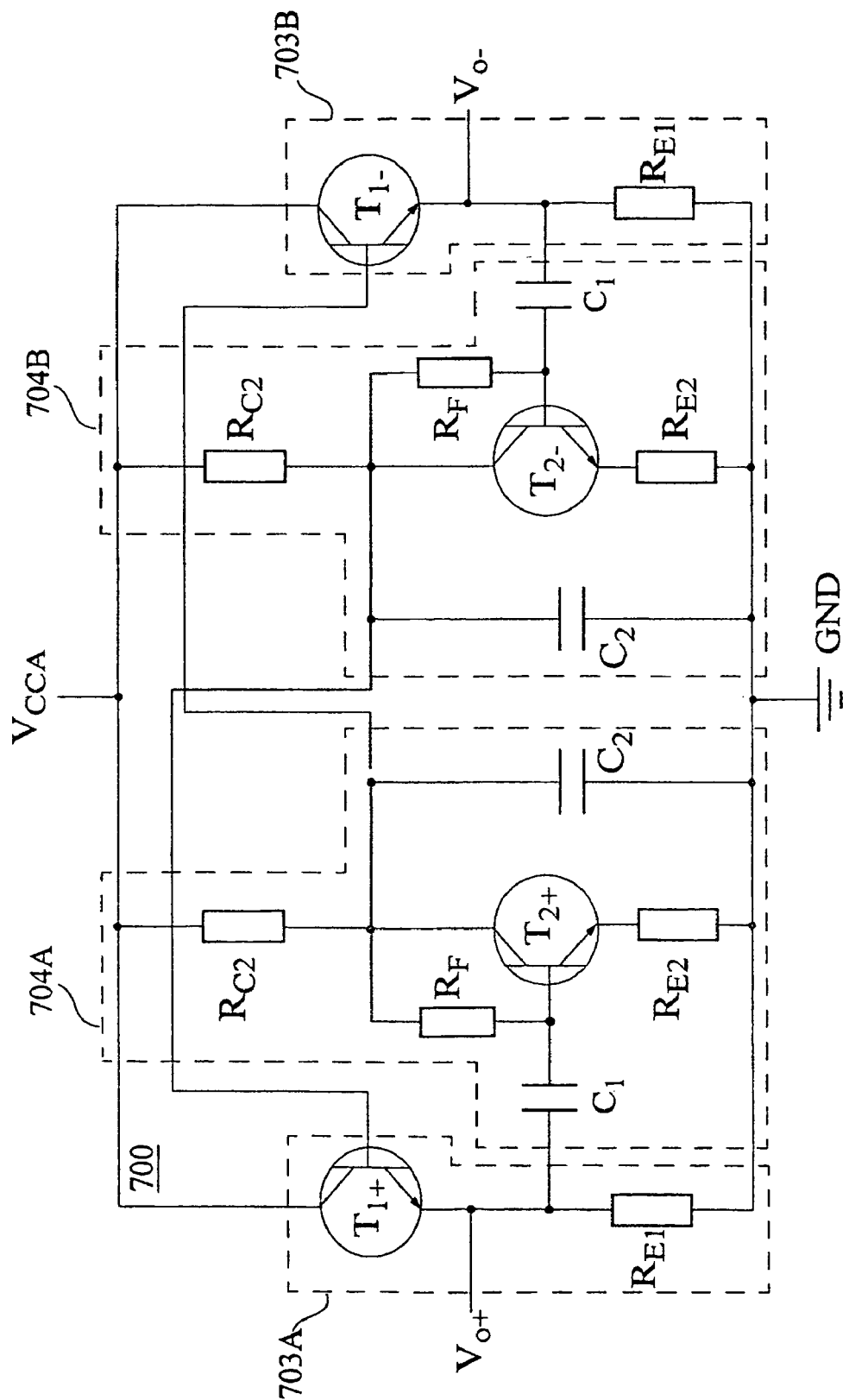
FIG. 14 is a schematic circuit diagram of a cross-coupled oscillator according to the invention.

As mentioned earlier, cross-coupled topologies may also benefit from the enhanced phase shift filter of the invention. FIG. 14 is a schematic circuit diagram of a cross-coupled oscillator according to the invention. A cross-coupled variant can be designed using two sides, each of which comprises a low-impedance oscillator amplifier buffer 703A/703B and a phase shift filter 704A/704B, and connecting the output from one side to the input of the other side and vice versa. Such a cross-coupled arrangement requires that the phase shift filters are designed to operate with a phase shift of one half cycle (180°) at the oscillation frequency, instead of the zero phase shift implied in the oscillator topology presented in FIG. 8. The topology of FIG. 8 is based on two local in-phase feedback systems that are interconnected by a common phase shift link. For the cross-coupled design, on the other hand, there is only a single feedback loop.

Each phase shift filter 704A/704B comprises an inverting amplifier with a filter-order enhancing internal feedback resistor $R_F$, an input capacitor $C_1$ and an output capacitor $C_2$, forming a lead-and-lag filter network of second order. The time constants of the lead-and lag network are adjusted properly to ensure that the total phase shift is 180° at the oscillation frequency.

Although the invention is generally applicable, it should be pointed out that the invention is particularly suitable in high performance and high speed synchronous digital electronics systems and communication links with tight timing budgets and/or harsh spectral purity requirements for reference clocks, and for operation in noisy environments such as densely packed mixed analog and microprocessor/digital systems. In particular, transmitters and receivers used in wireless applications commonly employ a frequency multiplexed scheme where several independent analog or digital base-band signals are modulated on separate but closely spaced radio frequency carriers to form a set of channels. Extraction of the useful base-band data at the receiver side typically involves a down conversion mixer topology where the input RF signal is multiplied with a local oscillator clock signal. Because of the inherent spread spectrum tail output from a non-ideal oscillator with finite quality value, interfering signals from adjacent channels may also be down converted to the base-band. This will introduce noise or crosstalk between channels, which ultimately will affect the bit error rate for the whole transmission link. In such applications, it is consequently of outmost importance to utilize high-performance oscillators such as those proposed by the invention.

The embodiments described above are merely given as examples, and it should be understood that the present invention is not limited thereto. For example, improved rejection of power supply variation may be achieved through current source stabilization of the bias point. Current starved feedback amplifiers, which experience increased propagation delay, may be used for implementing phase shifts and/or for tuning the oscillation frequency. Further modifications, changes and improvements which retain the basic underlying principles disclosed and claimed herein are within the scope and spirit of the invention.

This invention claimed is:

1. An oscillator having at least one oscillator feedback system between an input and an output of a gain block, wherein said oscillator feedback system comprises:

a phase shift filter configured as a lead-and-lag network formed around at least one active amplifying element, the active element having a resistive filter order enhancing feedback loop coupled therein.

2. The oscillator according to claim 1, wherein said active amplifying element is an inverting amplifier.

3. The oscillator according to claim 2, wherein said lead-and-lag network further comprises an input capacitor blocking the input of the inverting amplifier and an output capacitor shunting the output of the inverting amplifier to ground, thereby defining the lead-and-lag filter network.

4. The oscillator according to claim 1, wherein said filter-order enhancing feedback loop comprises a number of interconnected reactive blocks, each one of said reactive blocks comprising a parallel resistor-capacitor network, wherein the resistor and capacitor combination in each said reactive block corresponds to an individually set corner frequency for providing a customized, non-linear frequency response of the phase shift filter.

5. The oscillator according to claim 1, wherein said oscillator feedback system comprises several said phase shift filters, and said filter-order enhancing feedback loop is associated with said phase shift filter.

6. An oscillator having at least one oscillator feedback system between an input and an output of a gain block and a number of phase shift filters arranged in a ring topology, wherein at least one of said number of phase shift filters is configured as a lead and lag network formed around at least one active amplifying element, the active amplifying element coupled therein with a filter-order enhancing feedback loop for shaping the phase shift function of the phase shift filter to enable higher order phase shift filtering.

7. An oscillator having at least one oscillator feedback system between an input and an output of a gain block and a cross-coupled oscillator feedback system comprising a number of phase shift filters, wherein at least one of said number of phase shift filters is configured as a lead and lag network formed around at least one active amplifying element, the active amplifying element coupled with a filter-order enhancing feedback loop for shaping the phase shift function of the phase shift filter to enable higher order phase shift filtering.

8. The oscillator according to claim 7, wherein said active amplifying element is an inverting amplifier.

9. The oscillator according to claim 8, wherein said lead and lag network further comprises an input capacitor blocking the input of the inverting amplifier and an output capacitor shunting the output of the inverting amplifier to ground, thereby defining the lead-and-lag filter network.

10. An oscillator having an oscillator feedback system between an input and an output of a gain block, wherein said oscillator feedback system comprises:

a phase shift filter configured as a lead-and-lag network formed around an active amplifying element; and a filter-order enhancing feedback loop coupled therein.

11. The oscillator according to claim 10, wherein said active amplifying element is an inverting amplifier.

12. The oscillator according to claim 11, wherein said lead and lag network further comprises an input capacitor blocking the input of the inverting amplifier and an output capacitor shunting the output of the inverting amplifier to ground, thereby defining the lead-and-lag filter network.

* * * * *